Feb. 6, 1962 E. S. PENCZEK ET AL 3,020,175
CHEMICAL CLEANING OF PRINTED CIRCUITS
Filed June 12, 1958
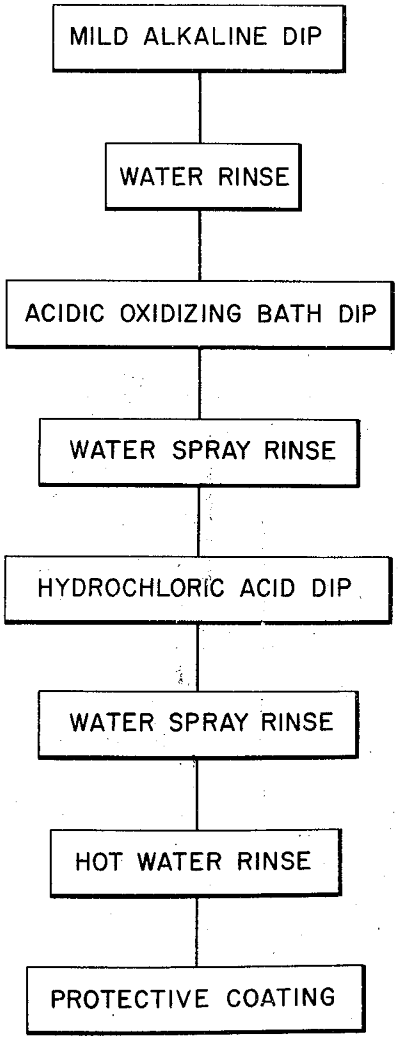
INVENTORS.
EDWARD S. PENCZEK
ROLLIN W. FURGUSON
BY Francis E. Blake
ATTORNEY United States Patent Office 3,020,175

Patented Feb. 6, 1962

3,020,175
CHEMICAL CLEANING OF PRINTED CIRCUITS

Edward S. Penczek, Rochester, and Rollin W. Furguson, Webster, N.Y., assignors to General Dynamics Corporation, Rochester, N.Y., a corporation of Delaware Filed June 12, 1958, Ser. No. 741,648
10 Claims. (Cl. 117—49)

This invention relates to a process for preparing printed wiring boards for soldering.

Printed circuits are now used in practically all types of electrical and electronic equipment, including, for example, radio, television, electronic computers, hearing aids, timing devices, test instruments, and industrial control circuits. These printed circuits usually include one or more printed wiring boards. Each board usually has a plastic insulating base having holes at predetermined, spaced locations that extend from one surface to another, and a pattern of copper conductors disposed on one surface of the base. Some of the conductors in the pattern are disposed about the holes for soldered connection to circuit component leads that are inserted in the holes, and these conductors are usually referred to as lands; other of the conductors provide contact pads; and still others provide interconnection paths or highways between lands and between lands and contact pads. Circuit components such as capacitors, resistors, and transistors, are mounted on the surface of the board opposite the surface on which the pattern of copper conductors is disposed; and these circuit components have their leads or pins inserted and physically secured in the holes, and electrically connected to the lands, by solder.

Frequently the contact pads are provided by solid plugs that extend from one surface of the plastic base to the other. The lands and interconnection paths usually are formed on one surface of the plastic insulating base by etching away the undesired parts of a copper film that is disposed on that surface of the base. After the holes have been punched in the base, and the circuit components have been mounted on the base with their leads inserted in the holes, the leads are soldered to the lands, usually by dip soldering. In this process, the board is floated across the surface of a pool of molten solder, with the printed side of the board in contact with the solder.

In a theoretically perfect dip soldering operation, the molten solder will wet equally all of the copper surfaces with which the solder comes in contact. In practice, however, uniform wetting and coating is difficult to obtain, because the presence of undesired substances, such as dirt, or films of oxides, carbonates, or other compounds, has an adverse effect. For example, when a printed wiring board is degreased, and then cleaned by brushing with a bristle brush and a common alkaline abrasive powder, such as, for example, one of the common household cleansers, and then rinsed thoroughly and dried, the copper appears to be clean and bright, and the solder seems to wet the copper quite well initially, but it tends to form balls. This phenomenon is observed not infrequently, and appears to be caused by some type of surface tension effect.

Since uniformity of solder coating is important to provide uniform electrical resistance, to improve the appearance of the printed wiring board, and to assure uniformly good electrical contacts throughout, an electroplating technique is now in common use to prepare printed wiring boards for soldering. In the usual practice of this technique, the copper on the base is coated with a photoresist coating, or other resistive coating, and solder is plated on the copper over the areas that are not covered. Thereafter, the resist coating is removed, and the undesired copper is etched away, without etching away the solder-coated copper. The base is then punched, the components are mounted, and the board is dip soldered. The solder forms a uniform coating over the previously solder-plated lands, paths, and contact pads. Excellent results are obtained. However, this technique is costly and requires the use of special equipment.

To etch the copper, there are several known etching solutions, but ferric chloride solutions are very common and popular at present. However, when a ferric chloride solution is used for etching, the solution impregnates the plastic insulating base to a certain extent, and thereafter, when the base is exposed to the atmosphere, a film of ferric hydroxide forms that is highly tenacious and that is very difficult to remove. Neither scrubbing with abrasive powder, nor mechanical cleaning by abrading, will remove this film. This film tends to cause short circuits on the printed wiring boards and makes them less dependable.

One object of the present invention is to provide a simple yet effective process for cleaning the surface of copper conductors on printed wiring boards, to render the cleaned surface uniformly receptive to solder applied by dip soldering.

Another object of the invention is to provide a process for cleaning copper surfaces for soldering that will not require the costly special equipment that is necessary for the solder plating process heretofore used, but that will produce equivalent or superior results.

Another object of the invention is to provide a process for preparing the surfaces of copper conductors on printed wiring boards for soldering, that will remove ferric chloride and other impregnants that tend to form hydroxide films on the surface of the plastic insulating base.

Another object of the invention is to provide a process for cleaning the surface of copper conductors on printed wiring boards to prepare it for soldering, and that will remove oxide films readily, including cuprous oxide films.

Other objects of the invention will be apparent hereinafter from the specification and from the recital of the appended claims.

Our process comprises a series of sequential steps for cleaning the surfaces of copper conductors on printed wiring boards, that expose a surface of clean, bare metal, that is easily wet by solder. In one preferred embodiment of our process, after the board has been etched and any resists or marking inks have been removed, the printed surface of the board is cleaned of all soil by dipping, with agitation, in a mild alkaline cleaner, at a temperature in the range from room temperature to about 170° F., for about five seconds. The board is then rinsed immediately in clean running water. The printed board is then immersed for five to ten seconds in an acidic oxidizing bath, such as, for example, a bath containing a mixture of chromic and sulfuric acids, at room temperature. The acid mixture is then thoroughly rinsed off with a spray rinse, with sufficient force to exert some mechanical cleaning action on the surface of the board. The board is then dipped for three to five seconds in dilute hydrochloric acid, of sufficient strength to remove any salt film, such as a chromate film, formed on the copper in the acidic oxidizing bath. Next, the board is again spray rinsed with sufficient force so that there is some mechanical cleaning. The board is then dipped in hot rinse water to facilitate drying. The surface of the copper on the dried board is now chemically and mechanically clean. A protective coating is applied, that does not interfere with soldering. Many such protective coatings are available, that can be applied on the printed board either wet or dry. When water stripping protective coatings, such as water dip lacquers, are used, or when water soluble or water emulsion coatings are used, the board can be dipped wet in the protective coating solutions. When spray coating or roller coating is used, the boards should be dried before coating, in order to facilitate the application of the desired protective coating. The protective coating is then dried, at room temperature, or by force drying.

After the protective coating has been applied and dried, the printed wiring board is ready for storage, shipping, stamping, machining, assembling, and solder dipping.

The drawing is a schematic diagram showing the sequential steps that are involved in the chemical cleaning of a printed wiring board to prepare it for soldering, according to one embodiment of this invention.

One specific demonstration of the invention will now be described in detail, to illustrate one preferred manner in which the invention may be practiced. The base is a copper clad, glass cloth-reinforced plastic. The base is etched, using a printing process, and then degreased to remove printing ink.

A solution of trisodium phosphate is made up by adding about three ounces of trisodium phosphate to one gallon of water. The board is then dipped in this dilute alkaline solution, while agitating this solution, for a period of about five seconds. Immediately after removing the board from the alkaline bath, it is subjected to a spray rinse, with enough force behind the spray to remove residual dirt. Clean rinse water must be used. These steps remove soil that may have accumulated on the printed surface of the board from handling, and provide a mechanically clean surface. The alkaline cleanser also removes any residual greases or oils that were not removed by degreasing.

An acidic oxidizing bath is then prepared containing approximately three pounds of chromic acid and one pound of concentrated sulfuric acid per gallon of water. The board is now dipped in this acidic oxidizing bath at room temperature, for a period of about five to ten seconds. This bath removes tarnish and any oxide films on the surface of the copper, and removes, usually, five to twenty millionths of an inch of the copper.

In making up the acidic oxidizing bath, from about one and a half pounds to about six pounds of chromic acid per gallon can be used, together with one and one-half fluid ounces to about seven fluid ounces of standard concentrated sulfuric acid (about 96%). While the use of sulfuric acid is preferred, certain materials may be substituted for the sulfuric acid, such as, for example, one ounce to about seven ounces of sodium sulfate, or any other alkali metal sulfate or acid sulfate, such as sodium acid sulfate. Ammonium persulfate could be used in place of the chromic acid, but this chemical is unstable and fresh solutions must be used in order to obtain good results. Mixtures of chromic acid and hydrochloric acid, and chromic acid and nitric acid, can also be employed. Mixtures of sulfuric acid and potassium chromate or dichromate or sodium chromate or dichromate also are effective.

The acidic mixture is quickly and thoroughly rinsed off with a spray rinse of clean water that is directed against the printed surface of the board forcefully.

The board is then dipped for three to five seconds in a solution of hydrochloric acid having a concentration in the range from about 10% hydrochloric acid to about 50%. The concentration of the hydrochloric acid can vary over a wide range. In general, the more dilute the acid, the more often it must be replaced. However, since the board tends to absorb some of the acid solution, the subsequent water rinsing is more effective when less concentrated solutions are employed. In this step, chromate film is removed from the surface of the copper. This film hinders soldering only slightly, but wetting is improved when the film is removed. This step removes ferric chloride and any ferric hydroxide that has formed on and adjacent the surface of the board. The printed board is then rinsed with a spray rinse of clean water, and is then dipped in hot water to facilitate drying. The board is then floated on the surface of a bath of molten wax to provide a protective coating so that the board can be handled, stored, or shipped conveniently before soldering.

Many types of protective coatings are readily available, including water dip lacquers, wax emulsions, molten waxes, and rosin solutions, among others.

This chemical process for cleaning printed wiring borads imparts to the surface of the metallic conductors the characteristic of good solderability, and permits uniform flow of the solder and uniform coverage. Wetting of the metallic surfaces is even, and there is no problem with the formation of solder balls.

In practicing the process, the first two steps, comprising the removal of soil by an alkaline dip, and the subsequent spray rinse, can be omitted if the surface of the printed wiring board is already mechanically clean and substantially free from oils and soil. Variation is also possible in the rinse steps, and in the type of protective coating that is applied after the oxides have been removed. The acidic oxidizing bath, the hydrochloric rinse, and spray rinsing, are important for providing chemically clean, uniformly solderable metallic surfaces.

The process can be used for cleaning the surfaces of metallic conductors made of many copper alloys in addition to copper, but substantially pure copper is usually employed for printed wiring boards because of the ease with which the copper can be applied to the plastic base, and because of the superior electrical conductivity of substantially pure copper.

The process can be used to clean single or multiple boards, printed on one or both sides, before or after machining. After the boards have been protected with the final protective coating, they can be stored for long periods of time before further processing. The chemically cleaned boards, to which the protective coating has been applied, can be handled, machined, and assembled, without effecting the solderability of the surfaces of the metallic conductors. The present process eliminates the necessity for refluxing and resoldering printed circuit boards to produce satisfactory soldered boards.

While the invention has been described in connection with a specific embodiment thereof, it will be understood that it is capable of further modification, and this application is intended to cover any variations, uses, or adaptations of the invention following, in general, the principles of the invention and including such departures from the present disclosure as come within known or customary practice in the art to which the invention pertains and as may be applied to the essential features hereinbefore set forth, and as fall within the scope of the invention or the limits of the appended claims.

We claim:

1. A chemical cleaning process for preparing for dip soldering the surfaces of copper conductors that are disposed on the surface of an insulating base of a printed wiring board, comprising subjecting said board to the action of an acidic oxidizing bath for a sufficient period of time to remove tarnish and surface films from the copper conductors, then spray rinsing said board with a clean aqueous rinse, then subjecting said board to an aqueous mineral acid bath to remove any salt formed on said conductor surfaces in said acidic oxidizing bath, then rinsing said surface free of residual acid with an aqueous spray rinse.

2. A process according to claim 1 in which the acidic oxidizing bath contains active ingredients consisting essentially of six parts of chromic acid to one part by weight of sulfuric acid to one gallon of water.

3. A chemical cleaning process for preparing for dip soldering the surfaces of copper conductors that are disposed on the surface of an insulating base of a printed wiring board, comprising subjecting said board to the action of an acidic oxidizing bath, whose active ingredients consist essentially of chromic acid and sulfuric acid, for a sufficient period of time to remove tarnish and surface films from the copper conductors and to remove an amount of copper from said conductors whose thickness is in the range from about 5 millionths to about 20 millionths of an inch, then subjecting said board to the action of a bath of dilute hydrochloric acid for a sufficient time to remove any chromate film that may have formed on the surface of said copper conductors, and then rinsing said board free of residual acid with an aqueous spray rinse.

4. A chemical cleaning process for preparing for dip soldering the surfaces of a printed wiring board having an insulating base and a pattern of copper conductors disposed thereon and formed by exposing portions of a copper clad insulating base to an etching bath containing iron as ferric ions, to prepare the surfaces of said copper conductors for soldering, comprising subjecting said board to the action of an acidic oxidizing bath for a sufficient period of time to remove tarnish and surface films from the copper conductors, then subjecting said board to an aqueous acidic bath to remove any salt formed on said conductor surfaces in said acidic oxidizing bath and to render soluble and remove residual iron from the surface of the base, and then rinsing said board surface free of residual acid.

5. A chemical cleaning process for preparing for dip soldering the surfaces of a printed wiring board having an insulating base and a pattern of copper conductors disposed thereon and formed by exposing portions of a copper clad insulating base to an etching bath containing iron as ferric ions, to prepare the surfaces of said copper conductors for soldering, comprising subjecting said board to the action of an acidic oxidizing bath whose active ingredients consist essentially of chromic acid and sulfuric acid, for a sufficient period of time to remove tarnish and surface films from the copper conductors, then subjecting said board to the action of a dilute aqueous bath of hydrochloric acid for a sufficient time to remove any chromate salt formed on said conductor surfaces in said acidic oxidizing bath and to render soluble and remove residual iron from the surface of the base, and then rinsing said board free of residual acid with a clean water spray rinse.

6. A chemical cleaning process for preparing for dip soldering the surfaces of a printed wiring board having an insulating base and a pattern of copper conductors disposed thereon and formed by exposing portions of a copper clad insulating base to an etching bath containing iron as ferric ions to prepare the surfaces of said copper conductors for soldering, comprising subjecting said board to the action of an acidic oxidizing bath for a sufficient period of time to remove tarnish and surface films from said copper conductors and to remove a portion of the copper from said conductors in an amount representing a thickness in the range of between about 5 millionths and about 20 millionths of an inch, rinsing said surface of said board with an aqueous spray rinse, then subjecting said board to the action of a dilute aqueous solution of hydrochloric acid for a sufficient time to remove any salt formed on said conductor surfaces in said acidic oxidizing bath and to render soluble and remove residual iron from the surface of the base, and then rinsing said board free of residual acid.

7. A chemical cleaning process for preparing for dip soldering the surfaces of a printed wiring board having an insulating base and a pattern of copper conductors disposed thereon and formed by exposing portions of a copper clad insulating base to an etching bath containing iron as ferric ions to prepare the surfaces of said copper conductors for soldering, comprising cleaning the surface of said board on which said conductors are disposed by steps including dipping said board in a mild alkaline cleaning solution with agitation, said mild alkaline cleaning solution having a 68° F. to 170° F. temperature range, then rinsing, and then subjecting said surface of said board to the action of an aqueous acidic oxidizing bath whose active ingredients consist essentially of chromic acid and sulfuric acid, for a sufficient period of time to remove tarnish and surface films from said copper conductors and to remove an amount of copper therefrom representing a copper thickness of about 5 millionths to about 20 millionths of an inch, then subjecting said board to a spray rinse of clean water, then subjecting said board to the action of a dilute aqueous bath of hydrochloric acid for a sufficient time to remove any chromate salt formed on said conductor surfaces in said acidic oxidizing bath and to render soluble and remove residual iron from the surface of the base, rinsing said board surface free of residual acid by a water spray rinse, and then applying an organic protective coating over said board to protect said board until it is ready for soldering.

8. A process according to claim 1 followed by the step of applying an organic protective coating over said board to protect said board until it is ready for soldering.

9. A process according to claim 7 in which the organic protective coating is a wax.

10. A process according to claim 7 in which the organic protective coating is a water dip lacquer.

References Cited in the file of this patent

UNITED STATES PATENTS

| | | |
|---|---|---|
| Re. 22,887 | Spence et al. | June 3, 1947 |
| 1,956,169 | Gelstharp et al. | Apr. 24, 1934 |
| 2,257,133 | Shoemaker | Sept. 30, 1941 |
| 2,699,425 | Nieter | Jan. 11, 1955 |
| 2,838,417 | Robinson et al. | June 10, 1958 |
| 2,861,029 | Bain et al. | Nov. 18, 1958 |
| 2,872,302 | Bulan | Feb. 3, 1959 |
| 2,908,557 | Black et al. | Oct. 13, 1959 |

OTHER REFERENCES

Hyler: Organic Finishing, May 1953, pp. 7–10.

Electrical Manufacturing (Multiple Reprint No. 8), Printed Circuits, February 1954, pp. 68–70.